United States Patent
Gabriel et al.

(10) Patent No.: US 6,323,113 B1
(45) Date of Patent: Nov. 27, 2001

(54) INTELLIGENT GATE-LEVEL FILL METHODS FOR REDUCING GLOBAL PATTERN DENSITY EFFECTS

(75) Inventors: Calvin T. Gabriel, Cupertino; Tammy D. Zheng; Subhas Bothra, both of Fremont; Harlan L. Sur, Jr., San Leandro, all of CA (US)

(73) Assignee: Philips Electronics North America Corporation, New York, NY (US)

( * ) Notice: Subject to any disclaimer, the term of this patent is extended or adjusted under 35 U.S.C. 154(b) by 0 days.

(21) Appl. No.: 09/466,988

(22) Filed: Dec. 10, 1999

(51) Int. Cl.$^7$ .................................................. H01L 21/20
(52) U.S. Cl. ........................... 438/584; 438/17; 438/405; 438/626; 438/631; 438/791; 437/225; 257/207; 257/758
(58) Field of Search ...................... 438/584, 626, 438/631, 17, 405, 791; 437/225; 257/758, 207

(56) References Cited

U.S. PATENT DOCUMENTS

| | | | |
|---|---|---|---|
| 5,160,995 | * 11/1992 | Wada et al. ........................... | 257/207 |
| 5,278,105 | 1/1994 | Eden et al. ........................... | 437/250 |
| 5,636,133 | 6/1997 | Chesebro et al. ..................... | 364/491 |
| 5,639,697 | 6/1997 | Weling et al. ........................ | 437/225 |
| 5,658,833 | * 8/1997 | Chen et al. ........................... | 438/791 |
| 5,790,417 | * 8/1998 | Chao et al. ........................... | 364/491 |
| 5,854,125 | 12/1998 | Harvey ................................. | 438/626 |
| 5,861,342 | 1/1999 | Gabriel et al. ........................ | 438/631 |
| 5,902,752 | 5/1999 | Sun et al. ............................. | 437/195 |
| 5,923,947 | 7/1999 | Sur ....................................... | 438/17 |
| 5,923,969 | * 7/1999 | Oyamatsu ............................. | 438/183 |
| 5,965,941 | 10/1999 | Weling et al. ........................ | 257/758 |
| 5,985,699 | 11/1999 | Yokoyama ............................ | 438/128 |
| 6,054,362 | * 4/2000 | Chuang ................................. | 438/405 |

FOREIGN PATENT DOCUMENTS 0820100    1/1998   (EP) .

OTHER PUBLICATIONS

M. Carneiro, V. Dunton and D. Dimitrelis, "Effect of Wafer–Average and Within–die Polysilicon Pattern Density on Transistor Gate–Length Definition for Cell–Based CMOS Application–Specific Integrated Circuits," pp. 442–451, 1992, Electrochemical Society, Pennington, NJ.

* cited by examiner

Primary Examiner—Amir Zarabian
Assistant Examiner—Pho Luu
(74) Attorney, Agent, or Firm—Martine & Penilla, LLP (57) ABSTRACT

The present invention provides methods for intelligently filling a gate layer with dummy fill patterns to produce a target pattern density. A gate layout defining gate areas on the gate layer is provided along with a diffusion layout defining active diffusion areas over a semiconductor substrate. For the gate layout, a pattern density is determined. Then, the areas not occupied by the gate areas and the diffusion areas are determined. Additionally, a range of pattern densities is provided in a set of predefined fill patterns with each predefined fill pattern having a plurality of dummy fill patterns and being associated with a pattern density within the provided range of pattern densities. Among the set of predefined fill patterns, a predefined fill pattern is selected for producing the target pattern density. Then, the gate layer is filled by placing the dummy fill patterns of the selected predefined fill pattern in the areas not occupied by the gate areas and the diffusion areas. In so doing, the target pattern density is provided in the gate layer when combined with the pattern density of the gate layout.

34 Claims, 10 Drawing Sheets

INTELLIGENT GATE-LEVEL FILL METHODS FOR REDUCING GLOBAL PATTERN DENSITY EFFECTS

BACKGROUND OF THE INVENTION

1. Field of the Invention

This invention relates generally to the field of integrated circuit designs. More particularly, the present invention relates to gate layer filling on semiconductor substrates.

2. Description of the Related Art

In semiconductor processing, dummy fill patterns have been used in diffusion mask and metal mask to prevent dishing effects from chemical-mechanical polishing (CMP) and to minimize the effects of device-to-device variations in pattern density. For example, in conventional shallow trench isolation processes, N+ and P+ diffusion islands are isolated by oxide filled trenches. The formation of the shallow trench involves etching of the silicon trench patterns into a silicon trench and subsequently filling the trenches with a thick oxide layer. The oxide layer is then planarized by using processes such as CMP, resist etchback, or oxide etchback processes. In these cases, the polish rate or etch rate is a function of the pattern density, which is defined as the percentage of the area that is occupied by diffusion patterns.

In order to ensure a uniform removal of the oxide over an entire wafer or substrate, the pattern density should ideally remain relatively the same over all areas. To achieve the relatively uniform pattern density, the "white space" or field on the semiconductor substrate is often filled with dummy diffusion patterns. After filling the white space with the dummy fill patterns, circuit areas (e.g., dense diffusion patterns) and the field areas on the semiconductor substrate will have relatively similar pattern densities. It should be noted that the dummy fill patterns, also referred herein as fill pattern diffusion regions, are not used to form active semiconductor devices. Instead, the dummy fill patterns are used to produce a more even or consistent diffusion pattern density.

Dummy fill patterns are well known in the art and are described, for example, in U.S. Pat. No. 5,923,947, entitled "Method for Achieving Low Capacitance Diffusion Pattern Filling" and in U.S. Pat. No. 5,854,125, entitled "Dummy Fill Patterns to Improve Interconnect Planarity." The disclosures of these patents are incorporated herein by reference.

Figure 1A:
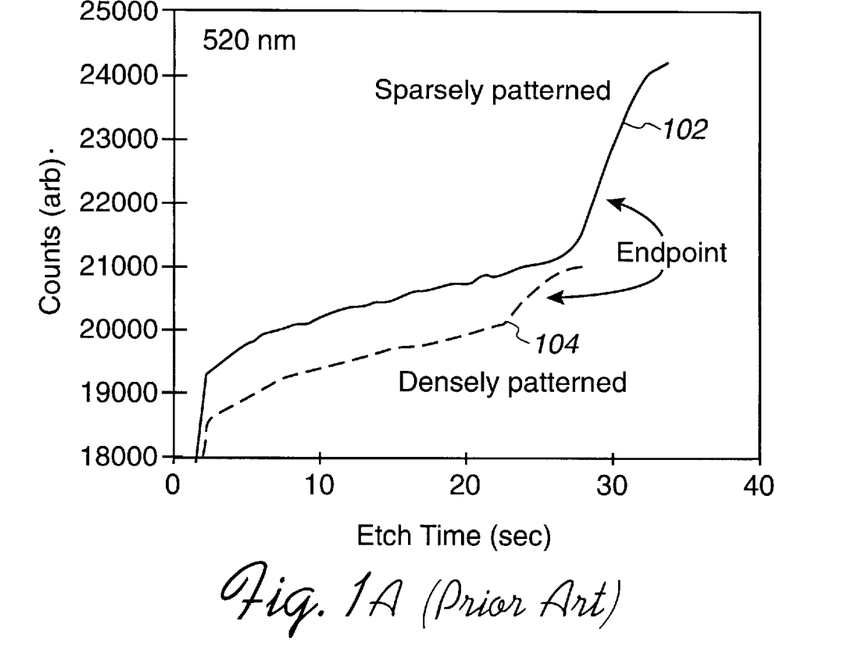
FIG. 1A is a graph showing a relationship between optical emission intensity at 520 nm from a polysilicon etch plasma as a function of etch time.

In conventional applications, dummy fill patterns are often applied to open spaces over a semiconductor substrate so that a global pattern density of about 50% is typically achieved regardless of the original circuit design density. Unfortunately, while such an arrangement works reasonably well for diffusion and metal masks, it is generally not acceptable for a gate mask due to degradation of endpoint signal and polysilicon to oxide etch rate selectivity. For example, FIG. 1A is a graph showing a relationship between optical emission intensity at 520 nm from a polysilicon etch plasma as a function of etch time. In this graph, the endpoint signal strength, which is used to detect the endpoint of a polishing wafer, is shown to exhibit substantial variance depending on the polysilicon pattern density. In particular, the endpoint of a sparsely patterned polysilicon layer 102 differs substantially from the endpoint of a densely patterned polysilicon layer 104.

Figure 1B:
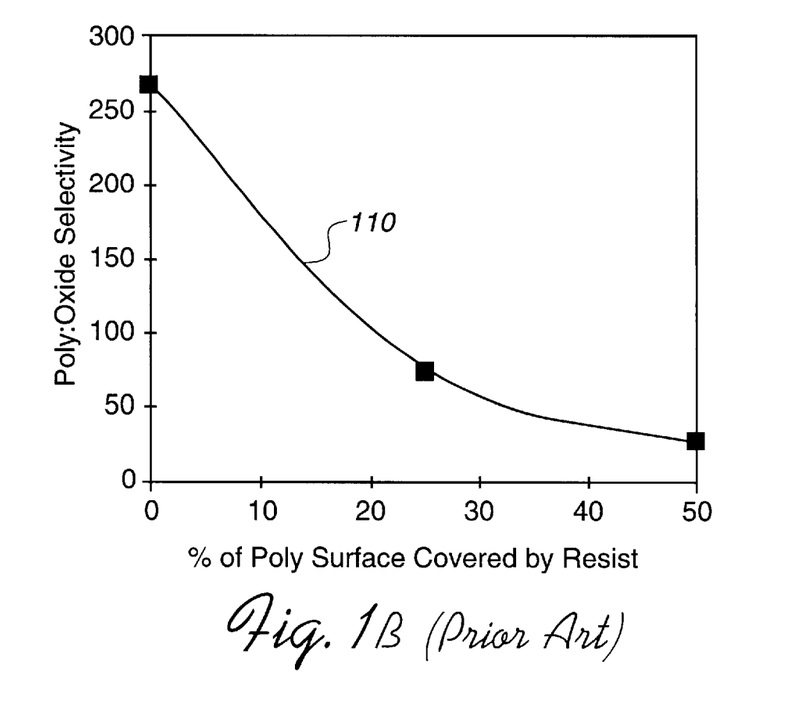
FIG. 1B is a graph illustrating substantial variation of poly:oxide selectivity as the percentage of digitization, which is the percentage of poly surface covered by a resist, varies.

On the other hand, FIG. 1B is a graph illustrating substantial variation of poly:oxide selectivity 110 as the percentage of digitization, which is the percentage of poly surface covered by a resist, varies. This variation results in lower selectivity for patterns with more resist. As shown, the poly:oxide selectivity drops off substantially as the digitization percentage increases from 0 to 50 percent.

Figure 1C:
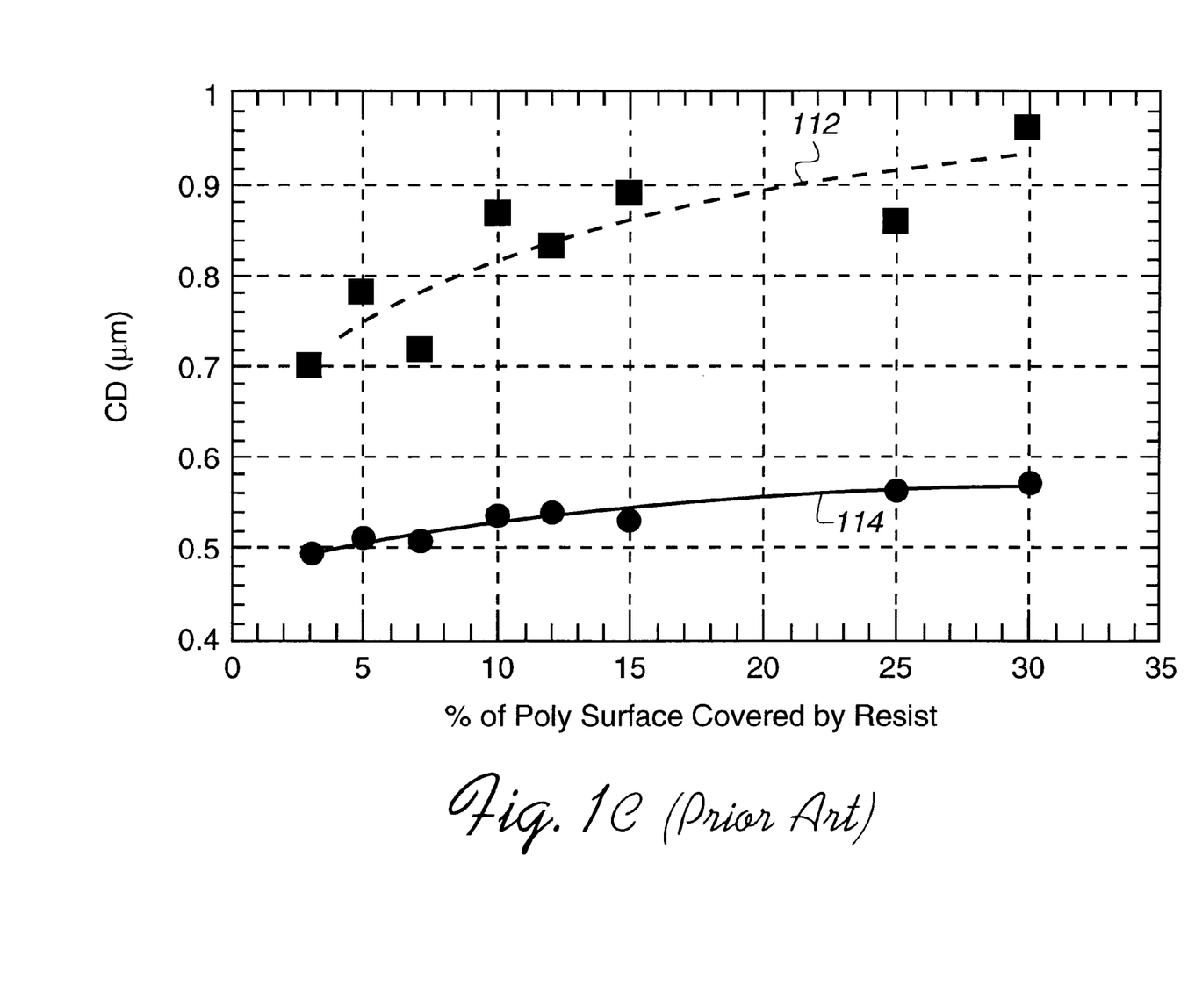
FIG. 1C shows a graph depicting the effect of varying gate pattern density on electrical critical dimension and effective channel length of an exemplary n-channel transistor.

Despite such drawbacks of the fill patterns in conventional gate masks, the dummy fill patterns are nevertheless used frequently for gate masks because they tend to reduce variations in polyline width or critical dimension (CD) such as electrical CD, effective channel length $L_{eff}$, or the like. These variations generally result from device-to-device variations in global pattern density. For example, FIG. 1C shows a graph depicting the effect of varying gate pattern density on electrical critical dimension 112 and effective channel length 114 of an exemplary n-channel transistor. The range of pattern densities in this graph encompasses the range of typical design parameters used in conventional fabrication processes. As shown, the electrical critical dimension and the effective channel length $L_{eff}$ for the n-channel transistor are substantially dependent on the global pattern density at the gate layer. In particular, the overall variation attributable to the pattern density is shown to be about 25% for electrical critical dimension and about 10% for $L_{eff}$. As can be appreciated by those skilled in the art, such significant variations are generally undesirable in semiconductor processing, especially in submicron processing.

Accurate control of the CDs and etch selectivity of polysilicon lines is generally of critical importance in the manufacturing of IC circuits as they affect the electrical characteristics of transistors. Precise control of these parameters is especially crucial for manufacturing application-specific ICs (ASICS) because ASICs typically exhibit a large variation in transistor density and layout.

Thus, what is needed is a method for defining and filling a gate layer targeted to a specified target pattern density so as to reduce variations in critical dimension while minimizing the degradation of endpoint signal and polysilicon to oxide selectivity.

SUMMARY OF THE INVENTION

Broadly speaking, the present invention fills these needs by providing methods for intelligently filling polysilicon gate layer with dummy fill patterns to produce a specified target pattern density. It should be appreciated that the present invention can be implemented in numerous ways, including as a process, an apparatus, a system, a device, program instructions in a computer readable medium, or a method. Several inventive embodiments of the present invention are described below.

In one embodiment, the present invention provides a method for intelligently filling a gate layer with dummy fill patterns to produce a target pattern density. A gate layout defining gate areas on the gate layer is provided along with a diffusion layout defining active diffusion areas over a semiconductor substrate. For the gate layout, a pattern density is determined. Then, the areas not occupied by the gate areas and the diffusion areas are determined. Additionally, a range of pattern densities is provided in a set of predefined fill patterns. Each predefined fill pattern has a plurality of dummy fill patterns and is associated with a pattern density within the provided range of pattern densities. Among the set of predefined fill patterns, a predefined fill pattern is selected for producing the target pattern density. Then, the gate layer is filled by placing the dummy fill patterns of the selected predefined fill pattern in the areas not occupied by the gate areas and the diffusion areas. In so doing, the target pattern density is provided in the gate layer when combined with the pattern density of the gate layout.

In another embodiment, the present invention provides an automated method for identifying dummy fill locations in a gate layer to produce a target pattern density. The method includes: (a) providing a gate layout and a diffusion layout, the polysilicon gate layout defining gate regions and the diffusion layout defining diffusion regions over a semiconductor substrate; (b) determining a pattern density of the gate mask over the semiconductor substrate; (c) creating combined union regions of the gate and diffusion regions; (d) taking an inverse of the combined union regions for identifying regions not occupied by the gate and diffusion regions; (e) providing a set of predefined fill patterns associated with a range of pattern densities, each predefined fill pattern having a plurality of dummy fill patterns and being associated with a pattern density within the range of pattern densities; (f) iterating through the set of predefined fill patterns and selecting a predefined fill pattern for generating the target pattern density; and (g) locating the dummy fill patterns of the selected predefined fill pattern in the identified regions that are not occupied by the gate and diffusion regions, wherein the located dummy fill patterns produce the target pattern density in the gate layer when combined with the gate regions.

In yet another embodiment, a method is disclosed for filling a gate layer to a target fill pattern density from a diffusion fill pattern. The diffusion fill pattern defines dummy fill pattern regions over a semiconductor substrate. In this method, a gate layout defining gate regions over the semiconductor substrate is provided. Then, the dummy fill pattern regions and the gate regions are combined to produce a combined union area. Additionally, a pattern density for the combined union area is determined. Based on the determined pattern density, the diffusion fill pattern is resized to generate resized diffusion fill pattern regions to be filled for producing the target fill pattern density. Then, the resized diffusion fill pattern regions are filled to provide the target fill pattern density in the gate layer when combined with the gate regions so as to substantially reduce global pattern density effects.

Advantageously, the present invention intelligently fills a gate layer to provide the same overall pattern density. By targeting such specific global pattern density, the intelligent filling methods of the present invention reduce variations in critical dimensions such as electrical critical dimension and effective channel width. In addition, the gate layer filled to the target pattern density serves to minimize the degradation of endpoint signal and, for example, polysilicon to oxide etch selectivity and microtrenching from increased attack on gate oxide. Other aspects and advantages of the invention will become apparent from the following detailed description, taken in conjunction with the accompanying drawings, illustrating by way of example the principles of the invention.

BRIEF DESCRIPTION OF THE DRAWINGS

The present invention will be readily understood by the following detailed description in conjunction with the accompanying drawings, in which like reference numerals designate like structural elements.

DETAILED DESCRIPTION OF THE PREFERRED EMBODIMENTS

In the following detailed description of the present invention, methods for intelligently filling polysilicon gate layer with dummy fill patterns to produce a specified target pattern density, numerous specific details are set forth in order to provide a thorough understanding of the present invention. However, it will be obvious to one skilled in the art that the present invention may be practiced without some or all of these specific details. In other instances, well known circuits, systems, and process operations have not been described in detail in order not to unnecessarily obscure the present invention.

The present invention provides methods for intelligently filling a layer with dummy fill patterns to produce desired pattern density. The layer that is to be filled may include materials such as polysilicon, amorphous silicon, silicides, metal, and the like. In the following examples, the methods are illustrated using an exemplary polysilicon gate layer. However, it should be appreciated that the methods of the present invention are equally applicable to other layers such as diffusion and metal layers.

Figure 2:
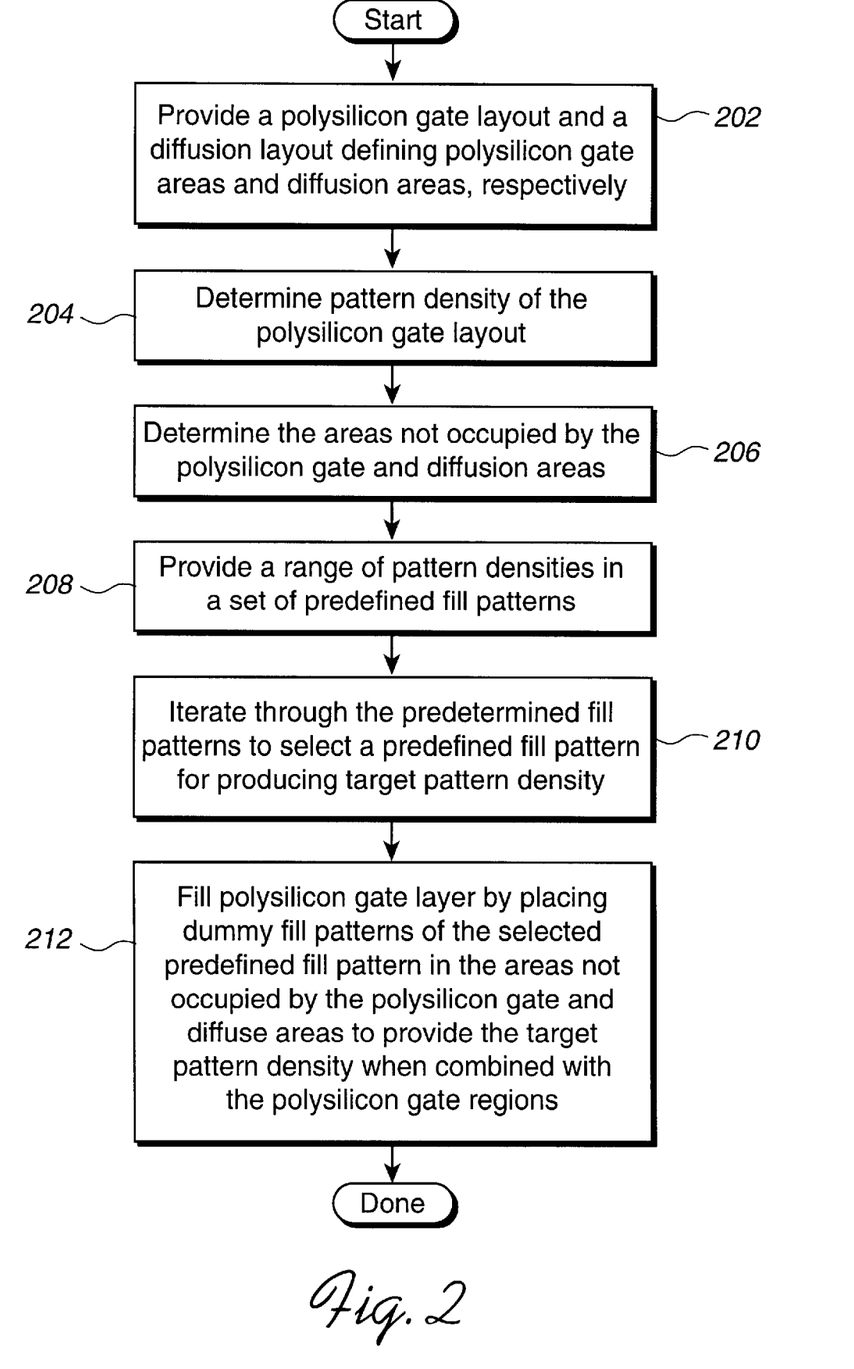
FIG. 2 shows a flowchart of an exemplary method for filling a polysilicon gate layer with dummy fill patterns to produce a target pattern density in accordance with one embodiment of the present invention.

FIG. 2 shows a flowchart of an exemplary method for filling a polysilicon gate layer with dummy fill patterns to produce a target pattern density in accordance with one embodiment of the present invention. The target pattern density of the polysilicon gate layer over a semiconductor wafer or substrate may be set to any desired pattern density. As used throughout herein, the target pattern density may be a specified pattern density or a range of specified pattern densities. In this method, a polysilicon gate layout and a diffusion layout, which can be used to produce respective masks, are provided in operation 202. The polysilicon gate layout defines polysilicon gate areas while the diffusion layout defines active diffusion areas. Then, in operation 204, the pattern density of the polysilicon gate layout is determined, for example, by dividing the polysilicon gate area by the total polysilicon layout area.

After determining the pattern density of the polysilicon gate layout, the areas not occupied or covered by the polysilicon gate and diffusion areas are determined in operation 206. For example, the unoccupied areas may be determined by first combining the polysilicon gate and diffusion areas and taking the inverse of the combined area. Additionally, the unoccupied areas may be sized down by a predetermined amount to provide a buffer zone. The buffer zone ensures that subsequent fill patterns, which will be placed in the unoccupied areas, do not come into contact with the combined polysilicon gate areas and diffusion areas.

Once the locations of the unoccupied areas have been identified, a range of pattern densities is provided in a set of predefined fill patterns in operation 208. Each of the predefined fill patterns are pre-designed to include a plurality of dummy fill patterns and is associated with a pattern density in the range of, for example, 5 percent to 50 percent. Preferably, the set of predefined fill patterns are provided in a table that can be loaded onto a computer memory for access.

The predefined fill patterns are then accessed in operation 210 and iterated through, one at a time, until a predefined fill pattern is selected for producing the target pattern density. In this operation, the predefined fill pattern is placed in the areas outside the buffer zone to determine a combined total pattern density of the predefined fill pattern and the polysilicon layout. In so doing, one of the predefined fill patterns that can most closely produce the target pattern density for the polysilicon gate layer is selected for generating the target pattern density when combined with the polysilicon gate regions. Based on the selected predefined fill pattern, the polysilicon gate layer is filled, in operation 212, by placing the dummy fill patterns of the selected predefined fill pattern in the areas not occupied by the polysilicon gate and diffuse areas. The generation of the specified target pattern density in the polysilicon gate layer allows accurate control of the critical dimensions (e.g., width, profile of polysilicon lines or gates) and polysilicon to oxide etch selectivity.

FIGS. 3A to 3E illustrate schematic top plan view of a portion 300 of a semiconductor wafer (e.g., substrate) for filling a polysilicon gate layer with dummy fill patterns to a desired target pattern density in accordance with one embodiment of the present invention. The semiconductor wafer portion 300 may contain any number of integrated circuit chips (ICs), each of which may include any suitable number of transistors. The wafer portion 300 defines a total area of layouts used in the present embodiment. As used herein, the term "area" refers to a space or location in a layer and is used interchangeable with the term "region."

Figure 3A:
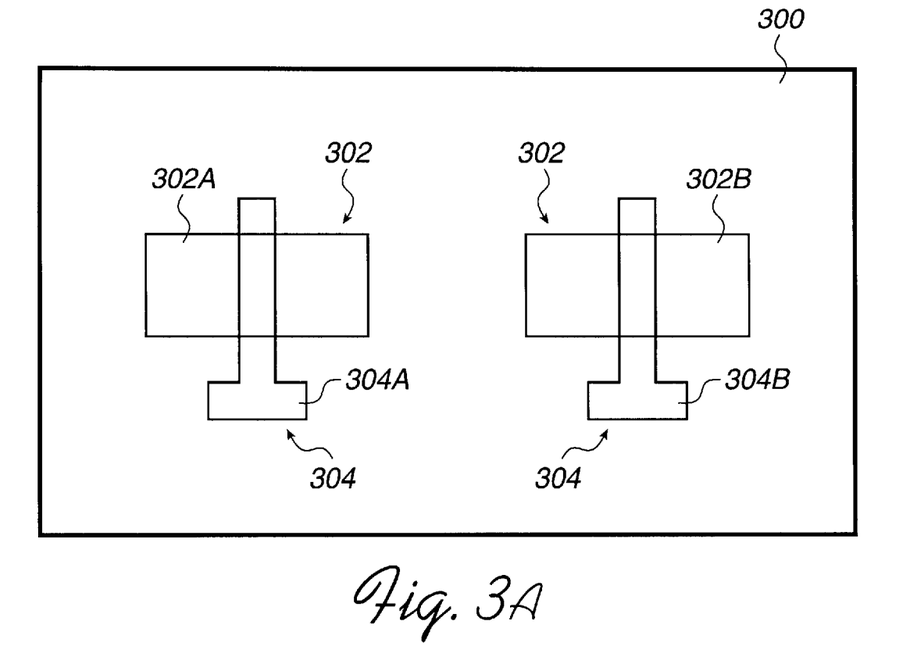
FIGS. 3A to 3E illustrate schematic top plan view of a portion of a semiconductor wafer for filling a polysilicon gate layer with dummy fill patterns to a desired target pattern density in accordance with one embodiment of the present invention.

FIG. 3A shows a schematic top plan view of a diffusion layout 302 and a polysilicon gate layout 304 overlaying the wafer portion 300, in accordance with one embodiment of the present invention. The diffusion layout 302 is defines a diffusion layer and includes diffusion layout areas 302A and 302B while the polysilicon gate layout 304 defines a polysilicon gate layer and includes polysilicon gate areas 304A and 304B. For the polysilicon gate layout 304, its pattern density may be determined, for example, by dividing the polysilicon gate areas 304A and 304B by the total area of the wafer portion 300. In one embodiment, if the pattern density of the polysilicon gate layout is above 20%, then a poly fill may not be needed. In such cases, a new polysilicon gate layout is generated only if the original pattern density of the polysilicon gate layout 304 is below 20%.

Based on the diffusion layout 302 and the polysilicon gate layout 304, the total area occupied by the diffusion layout areas 302A and 302B and the polysilicon gate areas 304A and 304B is computed. For example, the total area of the diffusion layout areas 302A and 302B and the polysilicon layout areas 304A and 304B can be computed by performing an "OR" operation between the diffusion layout 302 and the polysilicon gate layout 304.

Figure 3B:
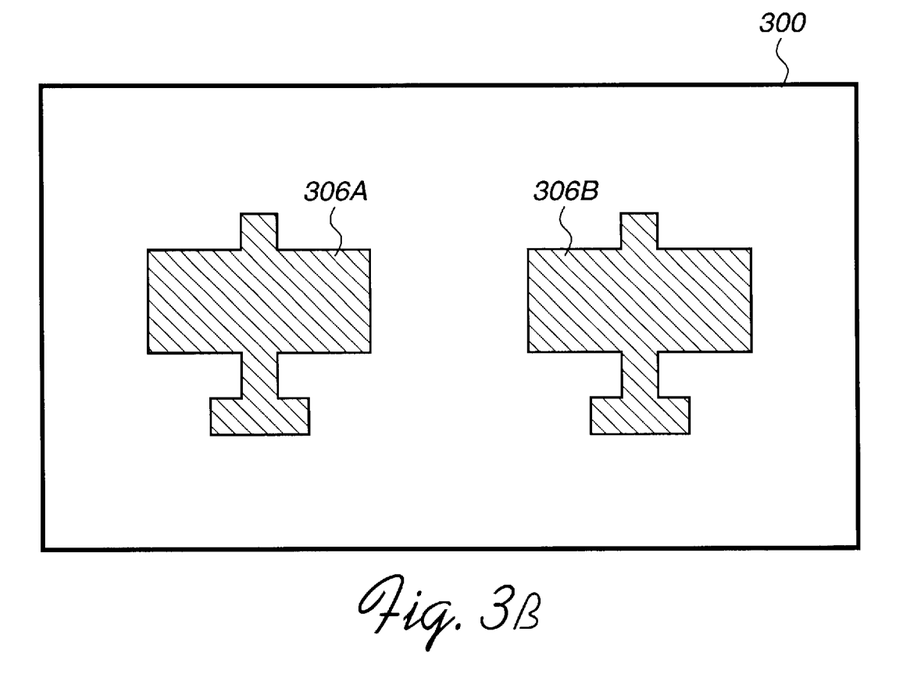

In accordance with one embodiment, FIG. 3B shows the resulting combined union areas 306A and 306B of the diffusion and polysilicon gate areas 302A, 302B, 304A, and 304B. The union of the diffusion and polysilicon gate areas 302A, 302b, 304A, and 304B serves to coordinate the filling of multiple layers of layouts. In particular, the determination of the combined union area 306A and 306B defines the region where fill patterns are not to be placed.

Figure 3C:
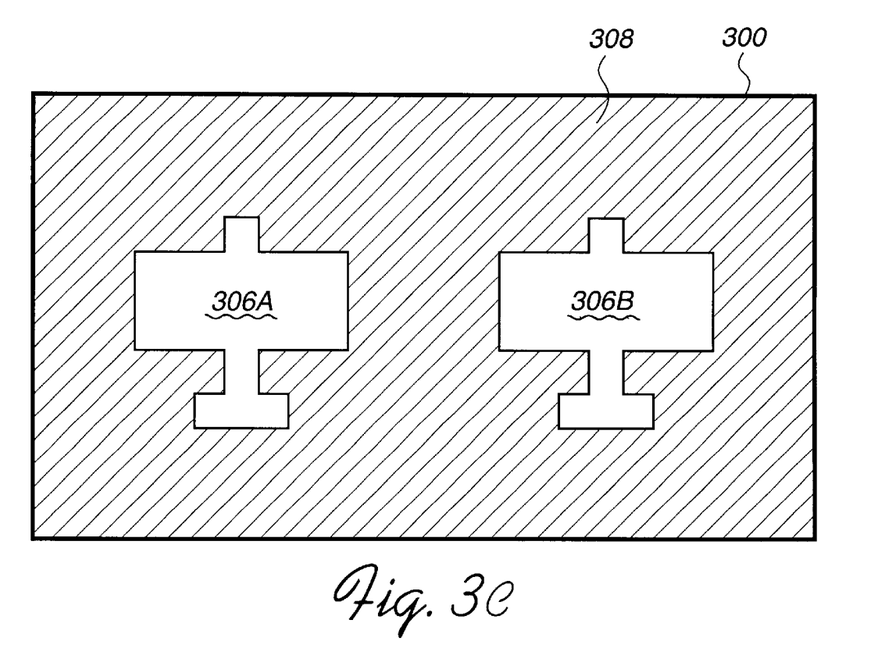

Conversely, to define the region where fill patterns will be subsequently placed, the regions not occupied by the combined union areas 306A and 306B are determined as indicated by inverse region 308 depicted in FIG. 3C. This inverse region 308 can be computed, for example, by taking an inverse of the combined areas 306A and 306B. The delineation of the inverse region 308 ensures that fill patterns will only be placed in areas outside the combined union areas 306A and 306B.

Figure 3D:
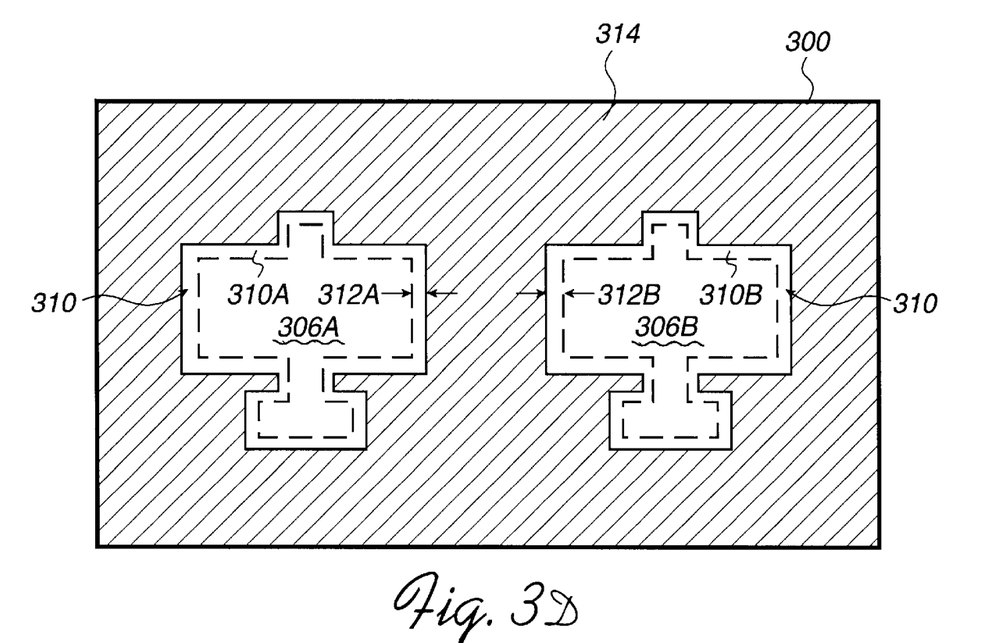

In accordance with a preferred embodiment, the inverse region 308 is further sized down by predetermined amounts 312A and 312B to provide a buffer region 310, thereby creating a new sized down inversion region 314. As shown in FIG. 3D, the buffer region 310 includes regions 310A and 310B, which have the effect of enlarging the size of the combined union areas 306A and 306B, respectively. This buffer region 310 is configured in size to further ensure that the fill patterns will not be placed on the combined union areas 306A and 306B. The configuration of the buffer regions 310A and 310B is a function of the predetermined amounts 312A and 312B, which are preferably the same size in all directions. The size of the predetermined amounts 312A and 312B may be anywhere between 0.2 $\mu$m and 50 $\mu$m, and more preferably between 0.5 $\mu$m and 10 $\mu$m, and most preferably 1 $\mu$m.

The operation 208 of setting up a set of predefined fill patterns described in the flowchart of FIG. 2 involves creating a group of predefined fill patterns having associated pattern densities. In one embodiment, the group of predefined fill patterns may be created to provide a range of desired pattern densities of preferably between 5% and 50%. However, any other desired range of pattern densities may also be used. Each predefined fill pattern includes a multitude of pre-designed dummy fill patterns that are configured to provide a unique fill density. Preferably, the fill patterns are provided such that the associated pattern densities are in equal increments such as 1%, 2%, 5%, 10%, 15%, etc. so as to provide desired degree of pattern density granularity. For example, small pattern density increments (e.g., 1%, 2%) would provide finer granularity for higher precision. Conversely, larger increments such as 10% pattern density will provide correspondingly coarser pattern density granularity. It should be appreciated, however, that any suitable number of predefined fill patterns may be provided in any suitable increments to provide the desired pattern density granularity.

The following Table 1 illustrates an exemplary set of predefined fill patterns F1 to F10 with corresponding pattern densities in a tabulated form.

TABLE 1

| Fi | F1 | F2 | F3 | F4 | F5 | F6 | F7 | F8 | F9 | F10 |
|---|---|---|---|---|---|---|---|---|---|---|
| Pattern Density | 5% | 10% | 15% | 20% | 25% | 30% | 35% | 40% | 45% | 50% |

As shown in Table 1, the predefined fill patterns Fi from F1 to F10 exhibit pattern densities in increments of 5 percent. The fill patterns Fi may be designed using any suitable patterns such as squares, rectangles, crosses, T-shapes, L-shapes, etc. to achieve desired fill pattern densities. The design of fill patterns using a variety of patterns is well known in the art and is described, for example, in U.S. Pat. No. 5,854,125 entitled "Dummy Fill Patterns to Improve Interconnect Planarity," which is incorporated herein by reference.

By way of example, the pre-designed fill patterns may be created in accordance with design rule width lines where the spacing between the lines is varied to achieve the desired global pattern density. For a simple poly line/space fill pattern, space width S may be computed from design rule linewidth L by evaluating $S=[L(1-Fi)]/Fi$. For instance, if L is 0.15 $\mu$m, then the space width S will be 2.85 $\mu$m for F1, 1.35 $\mu$m for F2, 0.85 $\mu$m for F3, etc.

The predefined fill patterns are then accessed, one at a time, until a predefined fill pattern that will provide the desired target pattern density for the polysilicon gate layout is identified as described previously in operation 210 of FIG. 2. In one embodiment, the predefined fill patterns F1 to FN are sequentially accessed for selecting an optimal predefined fill pattern. For example, the sized down inversion region 314 is combined with a fill pattern Fi by performing an AND operation to generate an overlap or intersection fill area, Gi. Then, the overlap fill area Gi and the original polysilicon gate areas 304A and 304B is combined by performing an "OR" operation to generate a combined union area Xi. If the union area Xi has a pattern density which is not within the target pattern density or target pattern density range, then the next predefined fill pattern can used to compute Gi and Xi by incrementing the index variable i.

Figure 3E:
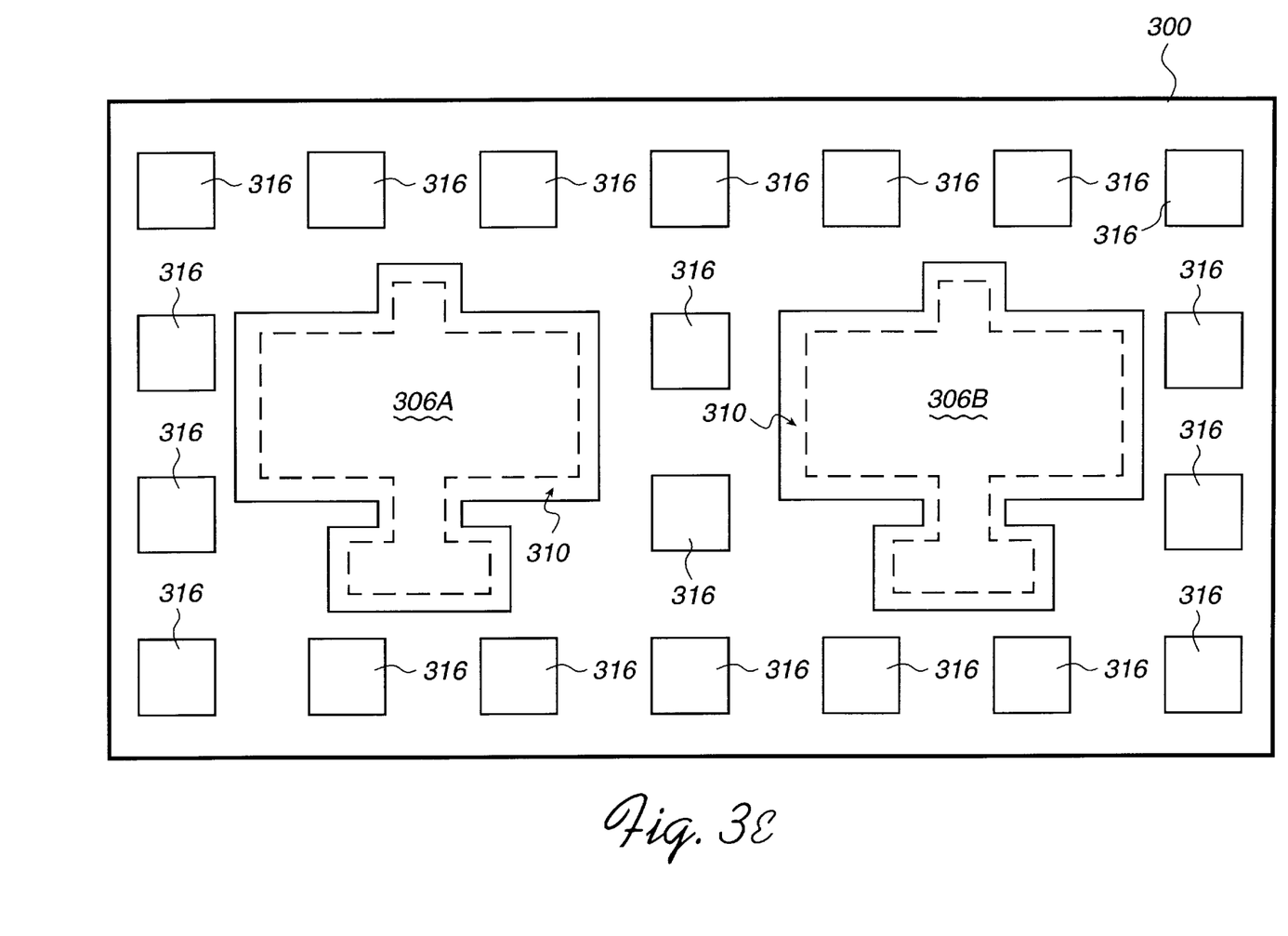

On the other hand, if the union area Xi has a pattern density of the target pattern density or within the target pattern density range, then the predefined fill pattern Fi is selected. The selected fill pattern Fi thus defines the gate layer areas 316 to be filled by dummy fill patterns to produce the target pattern density when combined with the original polysilicon gate areas. The selected fill pattern Fi can then be used to generate a new polysilicon gate layout having the desired target pattern density in combination with the original polysilicon gate areas as shown in FIG. 3E.

Figure 4:
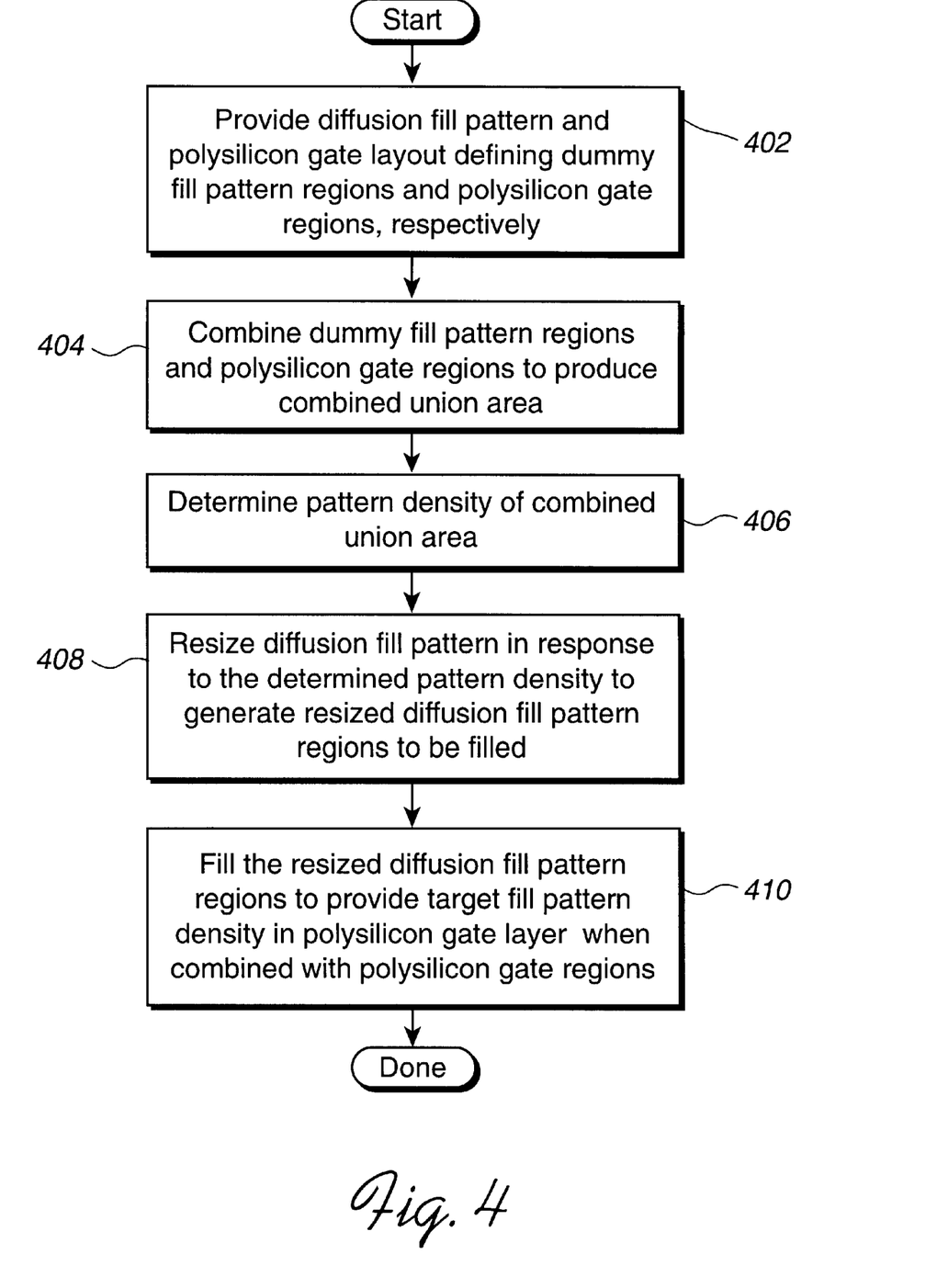
FIG. 4 illustrates a flowchart of an exemplary method for filling a polysilicon gate layer with dummy fill patterns to produce a target pattern density from an existing diffusion fill pattern according to another embodiment of the present invention.

In accordance with another embodiment of the present invention, FIG. 4 illustrates a flowchart of an exemplary method for filling a polysilicon gate layer with dummy fill patterns to produce a target pattern density from an existing diffusion fill pattern. The method starts by providing a pre-existing diffusion fill pattern and polysilicon gate layout in operation 402. The existing diffusion fill pattern defines dummy fill pattern regions on a wafer or a substrate while the polysilicon gate layout defines polysilicon gate regions. The dummy fill pattern regions and the polysilicon gate regions are combined, in operation 404, to produce a combined union area. For example, the diffusion fill pattern and the polysilicon mask can be combined by performing an "OR" operation. Then, in operation 406, the pattern density of the combined union area is determined. For instance, the combined dummy fill pattern regions and polysilicon gate regions may be divided by the total area of the layout to compute the pattern density.

The diffusion fill pattern may then be resized in response to the determined pattern density in operation 408. Specifically, the fill pattern regions of the diffusion fill pattern are resized to generate resized diffusion fill pattern regions that are to be filled to achieve the desired target pattern density. Then, in operation 410, the resized dummy fill pattern regions are filled to provide the target fill pattern density regions in the polysilicon gate layer when combined with the original polysilicon gate regions. The generation of the desired target pattern density in the polysilicon gate layer thus serves to accurately control the critical dimensions (e.g., width, profile of polysilicon lines or gates) and etch selectivity.

Figure 5A:
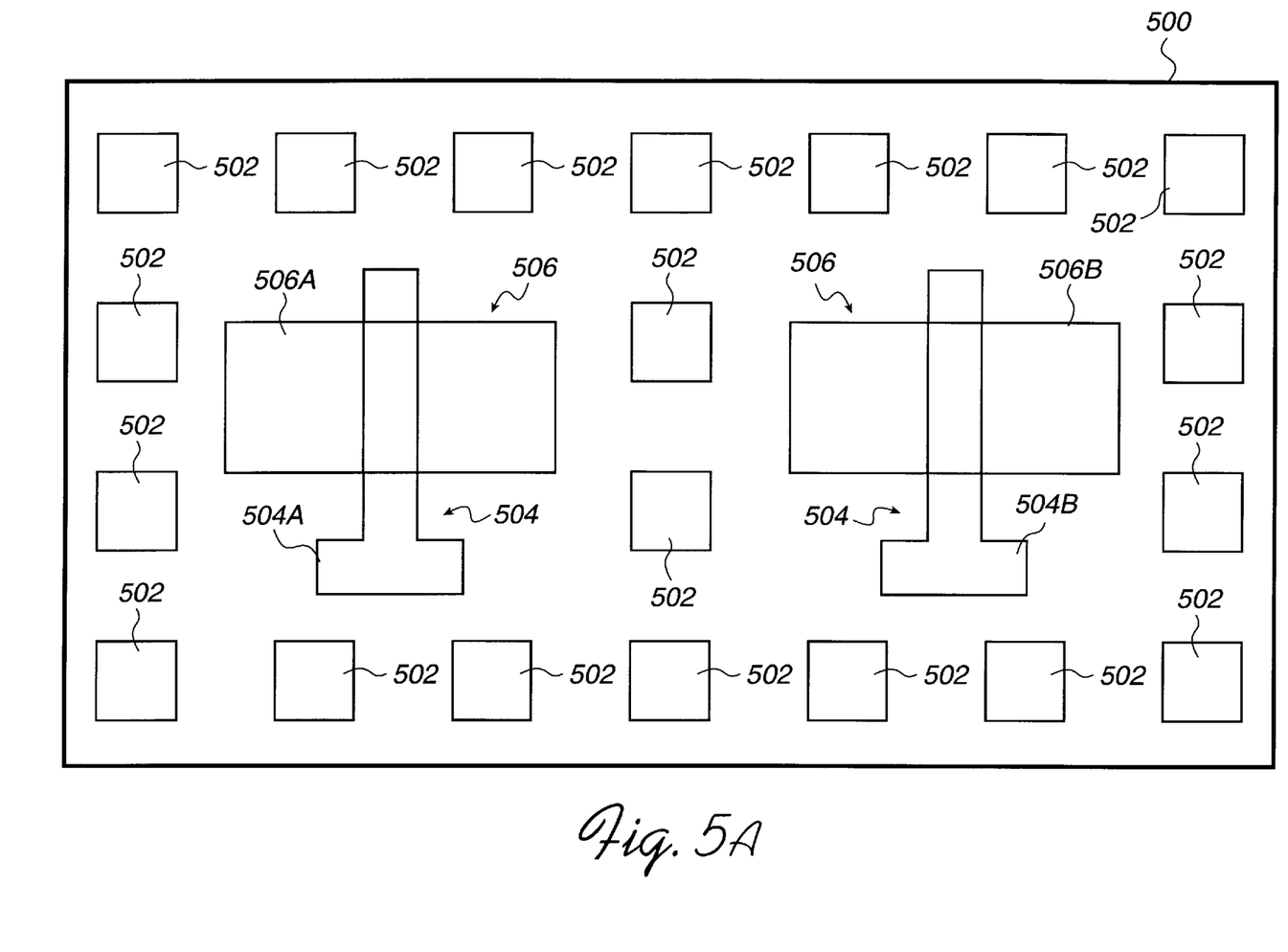
FIGS. 5A to 5C show schematic top plan view of a portion of a semiconductor wafer for filling a polysilicon gate layer to a target fill pattern density from an pre-existing diffusion fill patterns in accordance with one embodiment of the present invention.
Figure 5B:
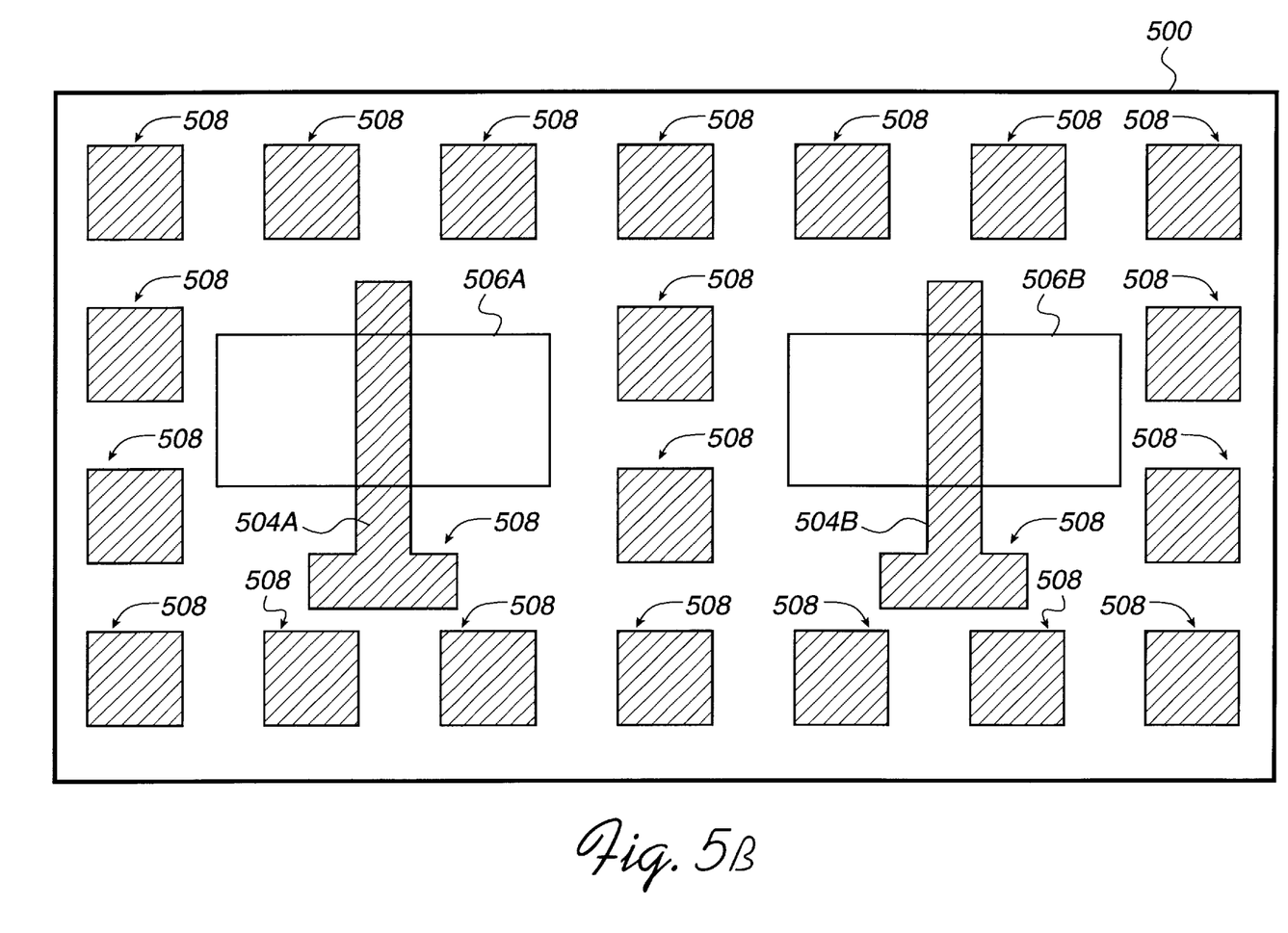
Figure 5C:
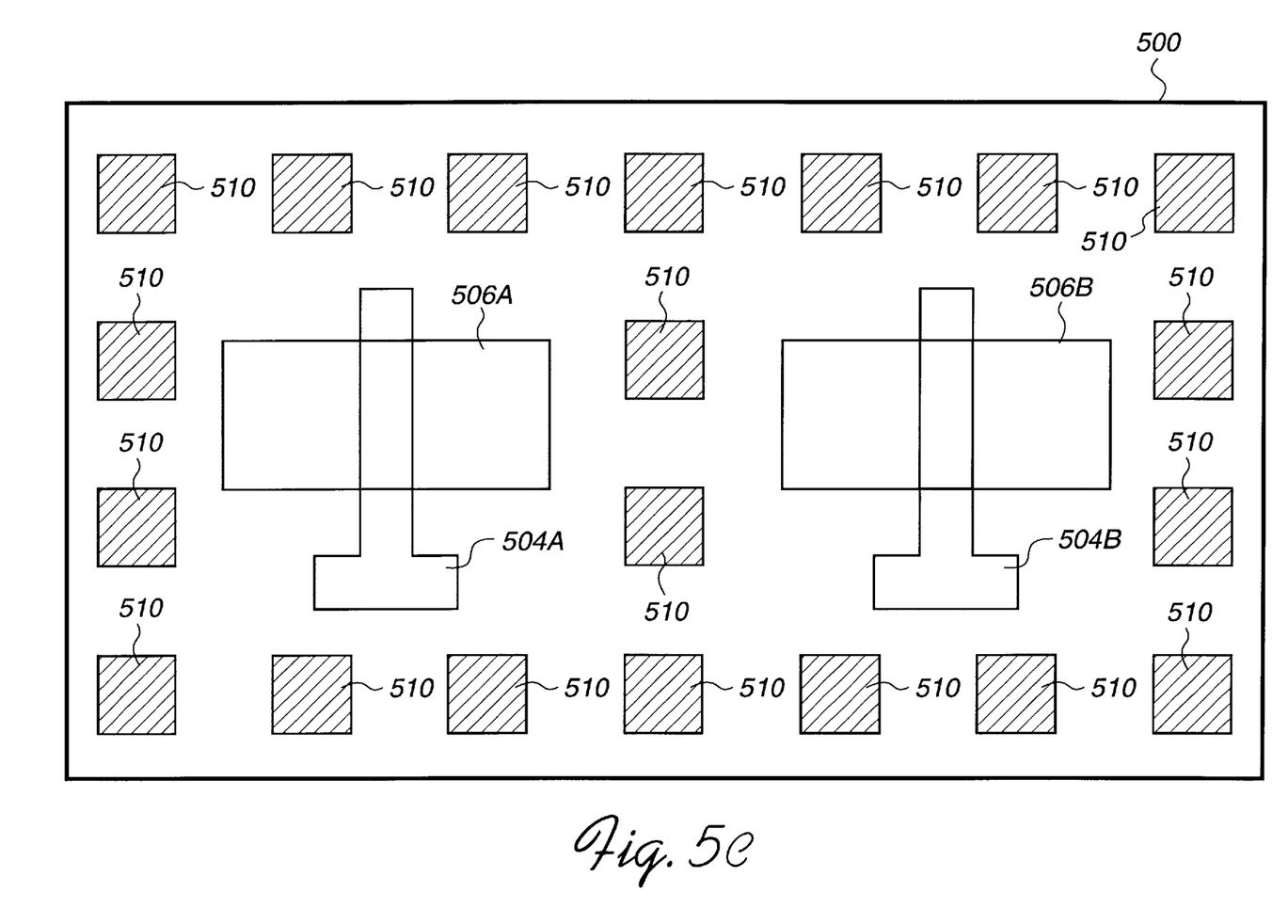

In accordance with one embodiment, FIGS. 5A to 5C show schematic top plan view of a portion 500 of a semiconductor wafer (e.g., substrate) for filling a polysilicon gate layer to a target fill pattern density from an pre-existing diffusion fill patterns. The semiconductor wafer portion 500 may include any number of IC chips, each of which, in turn, may include a multitude of transistors. The wafer portion 500 defines a total area of layouts in the present embodiment.

FIG. 5A illustrates a schematic top plan view of a diffusion fill pattern having a plurality of diffusion fill patterns 502 over the portion 500 of the semiconductor wafer. A polysilicon gate layout 504 and a diffusion layout 506 are provided over the wafer portion 500. The polysilicon gate layout 504 defines a polysilicon gate layer and includes polysilicon gate regions 504A and 504B. On the other hand, the diffusion layout 506 defines a diffusion layer and includes active diffusion regions 506A and 506B. The polysilicon gate regions 504A and 504B together with the diffusion regions 506A and 506B may be used to form transistors.

The polysilicon gate regions 504A and 504B are then combined with the diffusion patterns 502 to generate a combined union area 508 as shown in FIG. 5B. In one embodiment, the combined union area 508 is produced by performing an "OR" operation on the diffusion patterns 502 and the polysilicon gate regions 504A and 504B. Then, the pattern density for the combined union area 508 is computed, for example, by dividing the area of the combined union area 508 by the total layout area of the wafer portion 500.

In one embodiment, if the pattern density of the combined union area 508 is between an acceptable target pattern density range (e.g., 20% to 30%), the combined union area 508 is used as the final polysilicon fill layout. On the other hand, if the pattern density is greater than the target density, then the diffusion layout defined by the diffusion patterns 502 is sized down. The sizing down of the diffusion layout is performed to produce a resized diffusion fill pattern having dummy fill pattern regions that need to be filled to obtain the desired target density. For example, if the fill pattern area needed to be filled is less than the original fill pattern area, then the original fill pattern is sized down. Conversely, if the fill pattern area needed to be filled is greater than the original fill pattern area, the original fill pattern can be sized up to generate a resized fill pattern for producing the desired target density. However, if the areas are equal, then no resizing is needed.

FIG. 5C shows a schematic plan view of the wafer portion 500 depicting resized fill pattern regions 510 in accordance with one embodiment of the present invention. As shown, the original fill patterns 502 have been sized down to the new fill patterns 510 that are then filled to generate the target pattern density. Then, a final polysilicon layout with the target pattern density may be generated by combining the new fill patterns regions 510 with the original polysilicon gate regions 504A and 504B.

It should be noted that the filled dummy fill patterns of the various embodiments of the present invention will not be electrically connected to any active devices on the wafer portions 300 and 500. The exact design of the fill pattern is not critical from the standpoint of overall pattern density. However, the fill patterns are preferably designed with reasonably distributed lines and spaces so as to conform to design rules and minimize other undesirable effects. For example, the fill pattern may have design-rule-width lines where the spacing between the lines is varied to achieve the desired global pattern density.

Thus, the present invention intelligently fills gate layers with dummy fill patterns to achieve a specified target pattern density. Although the present invention is illustrated using polysilicon gate layers, it is equally suitable for other layers such as diffusion and metal layers and other layer materials such as polysilicon, amorphous silicon, silicides, metal, and the like. By targeting such specific global pattern density, the intelligent filling methods reduce variations in critical dimension. In addition, such gate layouts serve to minimize the degradation of endpoint signal and, for example, polysilicon to oxide etch selectivity.

By way of example, if the highest pattern density occurring in circuit designs is 30%, then only enough fill is added to raise all designs to 30%. If 30% pattern density results in an acceptable endpoint signal strength and poly:oxide selectivity for one design, it will generally be acceptable for other IC designs as well. Alternatively, a lower pattern density target, such as 20%, may be selected. In this case, fill would be added only to products with less pattern density than the lower pattern density target so as to bring the pattern density to 20%. In so doing, one of the benefits of reducing CD variation, especially for low pattern densities, while minimizing the impact on endpoint signal strength or poly:oxide selectivity.

While the present invention has been described in terms of several preferred embodiments, there are alterations, permutations, and equivalents which fall within the scope of this invention. It should also be noted that there are alternative ways of implementing both the method, device, and system of the present invention. It is therefore intended that the following appended claims be interpreted as including all such alterations, permutations, and equivalents as fall within the true spirit and scope of the present invention.

What is claimed is:

1. A method for intelligently filling a gate layer with dummy fill patterns to produce a target pattern density, comprising:

providing a gate layout and a diffusion layout, the gate layout defining gate areas on the gate layer and the diffusion layout defining active diffusion areas over a semiconductor substrate;

determining a pattern density of the gate layout over the semiconductor substrate;

determining the areas not occupied by the gate areas and the diffusion areas;

providing a range of pattern densities in a set of predefined fill patterns, each predefined fill pattern having a plurality of dummy fill patterns and being associated with a pattern density within the provided range of pattern densities; and selecting a predefined fill pattern from the set of predefined fill patterns for producing the target pattern density; and filling the gate layer by placing the dummy fill patterns of the selected predefined fill pattern in the areas not occupied by the gate areas and the diffusion areas so as to provide the target pattern density in the gate layer when combined with the pattern density of the gate layout wherein the gate layer is filled to the target pattern density only when the pattern density of the gate layout is below 20 percent.

2. The method as recited in claim 1, wherein the gate layer is comprised of a material selected from the group consisting of polysilicon, amorphous silicon, silicide, and metal.

3. The method as recited in claim 1, wherein the gate layer is a polysilicon gate layer and the gate layout is a polysilicon gate layout.

4. The method as recited in claim 1, further comprising:

generating a gate layer layout by combining the selected predefined fill patterns and the gate layout to provide the target pattern density in the gate layer.

5. A method for intelligently filling a gate layer with dummy fill patterns to produce a target pattern density, comprising:

providing a gate layout and a diffusion layout, the gate layout defining gate areas on the gate layer and the diffusion layout defining active diffusion areas over a semiconductor substrate;

determining a pattern density of the gate layout over the semiconductor substrate;

determining the areas not occupied by the gate areas and the diffusion areas, the determining further including, creating a combined union of the gate areas of the gate layout and the diffusion areas and the diffusion layout, and taking an inverse of the combined union so as to generate the areas not occupied by the gate and diffusion areas;

providing a range of pattern densities in a set of predefined fill patterns, each predefined fill pattern having a plurality of dummy fill patterns and being associated with a pattern density within the provided range of pattern densities; and selecting a predefined fill pattern from the set of predefined fill patterns for producing the target pattern density; and filling the gate layer by placing the dummy fill patterns of the selected predefined fill pattern in the areas not occupied by the gate areas and the diffusion areas so as to provide the target pattern density in the gate layer when combined with the pattern density of the gate layout.

6. The method as recited in claim 5, wherein the inverse of the union representing the areas not occupied by the gate and diffusion areas is sized down by a predetermined amount to provide a buffer region to ensure that the dummy fill patterns of the selected predefined fill pattern do not contact the gate areas and the diffusion areas.

7. The method as recited in claim 6, wherein the predetermined amount is between 0.2 μm and 50 μm.

8. The method as recited in claim 5, wherein the predefined fill pattern is selected b iterating through the set of predefined fill patterns and determining the associated pattern densities that are generated when combined with the pattern density of the gate layout.

9. A method for intelligently filling a gate layer with dummy fill patterns to produce a target pattern density, comprising:

providing a gate layout and a diffusion layout, the gate layout defining gate areas on the gate layer and the diffusion layout defining active diffusion areas over a semiconductor substrate;

determining a pattern density of the gate layout over the semiconductor substrate;

determining the areas not occupied by the gate areas and the diffusion areas;

providing a range of pattern densities in a set of predefined fill patterns wherein the predefined fill patterns provide the pattern density range between 5 percent and 50 percent, each predefined fill pattern having a plurality of dummy fill patterns and being associated with a pattern density within the provided range of pattern densities; and selecting a predefined fill pattern from the set of predefined fill patterns for producing the target pattern density; and filling the gate layer by placing the dummy fill patterns of the selected predefined fill pattern in the areas not occupied by the gate areas and the diffusion areas so as to provide the target pattern density in the gate layer when combined with the pattern density of the gate layout.

10. The method as recited in claim 9, wherein the gate layer is comprised of a material selected from the group consisting of polysilicon, amorphous silicon, silicide, and metal.

11. The method as recited in claim 9, wherein the gate layer is a polysilicon gate layer and the gate layout is a polysilicon gate layout.

12. The method as recited in claim 9, further comprising:

generating a gate layer layout by combining the selected predefined fill patterns and the gate layout to provide the target pattern density in the gate layer.

13. An automated method for identifying dummy fill locations in a gate layer to produce a target pattern density, comprising:

providing a gate layout and a diffusion layout, the gate layout defining gate regions and the diffusion layout defining diffusion regions over a semiconductor substrate;

determining a pattern density of the gate layout over the semiconductor substrate;

creating combined union regions of the gate regions and the diffusion regions;

taking an inverse of the combined union regions for identifying regions not occupied by the gate and diffusion regions;

providing a set of predefined fill patterns associated with a range of pattern densities wherein the set of predefined fill patterns are configured to be placed in the regions not occupied by the gate and diffusion regions for determining the associated pattern densities in combination with the pattern density of the gate layout, each predefined fill pattern having a plurality of dummy fill patterns and being associated with a pattern density within the range of pattern densities;

iterating through the set of predefined fill patterns and selecting a predefined fill pattern for generating the target pattern density; and locating the dummy fill patterns of the selected predefined fill pattern in the identified regions that are not occupied by the gate and diffusion regions, wherein the located dummy fill patterns produce the target pattern density in the gate layer when combined with the gate regions.

14. The method as recited in claim 13, wherein the gate layer is comprised of a material selected from the group consisting of polysilicon, amorphous silicon, silicide, and metal.

15. The method as recited in claim 13, wherein the gate layer is a polysilicon gate layer and the gate layout is a polysilicon gate layout.

16. The method as recited in claim 13, wherein the diffusion regions are active diffusion regions.

17. An automated method for identifying dummy fill locations in a gate layer to produce a target pattern density, comprising:

providing a gate layout and a diffusion layout, the gate layout defining gate regions and the diffusion layout defining diffusion regions over a semiconductor substrate;

determining a pattern density of the gate layout over the semiconductor substrate;

creating combined union regions of the gate regions and the diffusion regions;

taking an inverse of the combined union regions for identifying regions not occupied by the gate and diffusion regions wherein the inverse of the combined union regions is sized down by a predetermined amount to provide a buffer region to ensure that the located dummy fill patterns do not contact the gate regions and the diffusion regions;

providing a set of predefined fill patterns associated with a range of pattern densities, each predefined fill pattern having a plurality of dummy fill patterns and being associated with a pattern density within the range of pattern densities;

iterating through the set of predefined fill patterns and selecting a predefined fill pattern for generating the target pattern density; and locating the dummy fill patterns of the selected predefined fill pattern in the identified regions that are not occupied by the gate and diffusion regions, wherein the located dummy fill patterns produce the target pattern density in the gate layer when combined with the gate regions.

18. The method as recited in claim 17, wherein the located dummy fill patterns are filled in the gate layer to provide the target pattern density.

19. The method as recited in claim 17, wherein a gate layer layout is generated by combining the located dummy fill patterns with the gate regions to provide the target pattern density in the gate layer.

20. The method as recited in claim 19, wherein the gate layer layout having the target pattern density is generated only when the pattern density of the gate layout is below 20 percent.

21. The method as recited in claim 17, wherein the predetermined amount is between 0.2 μm and 50 μm.

22. An automated method for identifying dummy fill locations in a gate layer to produce a target pattern density, comprising:

providing a gate layout and a diffusion layout, the gate layout defining gate regions and the diffusion layout defining diffusion regions over a semiconductor substrate;

determining a pattern density of the gate layout over the semiconductor substrate;

creating combined union regions of the gate regions and the diffusion regions;

taking an inverse of the combined union regions for identifying regions not occupied by the gate and diffusion regions;

providing a set of predefined fill patterns associated with a range of pattern densities wherein the predefined fill patterns are adapted to provide the pattern density range between 5 percent and 50 percent, each predefined fill pattern having a plurality of dummy fill patterns and being associated with a pattern density within the range of pattern densities;

iterating through the set of predefined fill patterns and selecting a predefined fill pattern for generating the target pattern density; and locating the dummy fill patterns of the selected predefined fill pattern in the identified regions that are not occupied by the gate and diffusion regions, wherein the located dummy fill patterns produce the target pattern density in the gate layer when combined with the gate regions.

23. The method as recited in claim 22, wherein a gate layer layout is generated by combining the located dummy fill patterns with the gate regions to provide the target pattern density in the gate layer.

24. The method as recited in claim 22, wherein the gate layer is comprised of a material selected from the group consisting of polysilicon, amorphous silicon, silicide, and metal.

25. The method as recited in claim 22, wherein the gate layer is a polysilicon gate layer and the gate layout is a polysilicon gate layout.

26. A method for filling a gate layer to a target fill pattern density from a diffusion fill pattern, the diffusion fill pattern defining dummy fill pattern regions over a semiconductor substrate, the method comprising:

providing a gate layout defining gate regions over the semiconductor substrate;

combining the dummy fill pattern regions and the gate regions to produce a combined union area;

determining a pattern density of the combined union area;

resizing the diffusion fill pattern in response to the determined pattern density to generate resized diffusion fill pattern regions to be filled for producing the target fill pattern density wherein the diffusion fill pattern is sized down when the resized dummy fill pattern regions to be filled is less than the dummy fill pattern regions; and filling the resized diffusion fill pattern regions to provide the target fill pattern density in the gate layer when combined with the gate regions so as to substantially reduce global pattern density effects.

27. The method as recited in claim 26, wherein a gate layer layout is generated by combining the resized diffusion fill pattern regions with the gate regions.

28. The method as recited in claim 27, wherein the gate layer layout having the target fill pattern density is generated only when the pattern density of the gate layout is below 20 percent.

29. The method as recited in claim 26, wherein the combined union area is used in combination with the gate regions to produce the target fill pattern density when the pattern density of the combined union area is between 20 percent and 30 percent.

30. The method as recited in claim 29, wherein the combined union area of the dummy fill pattern regions and the gate regions is used without resizing the diffusion fill pattern.

31. A method for filling a gate layer to a target fill pattern density from a diffusion fill pattern, the diffusion fill pattern defining dummy fill pattern regions over a semiconductor substrate, the method comprising:

providing a gate layout defining gate regions over the semiconductor substrate;

combining the dummy fill pattern regions and the gate regions to produce a combined union area;

determining a pattern density of the combined union area;

resizing the diffusion fill pattern in response to the determined pattern density to generate resized diffusion fill pattern regions to be filled for producing the target fill pattern density wherein the diffusion fill pattern is sized up when the resized dummy fill pattern regions to be filled is greater than the dummy fill pattern regions; and filling the resized diffusion fill pattern regions to provide the target fill pattern density in the gate layer when combined with the gate regions so as to substantially reduce global pattern density effects.

32. The method as recited in claim 31, wherein the gate layer is comprised of a material selected from the group consisting of polysilicon, amorphous silicon, silicide, and metal.

33. The method as recited in claim 31, wherein the gate layer is a polysilicon gate layer and the gate layout is a polysilicon gate layout.

34. The method as recited in claim 31, wherein the diffusion fill pattern is sized down by shrinking the diffusion fill pattern when the pattern density of the combined union area is greater than 30 percent.

* * * * *